US009831094B2

(12) United States Patent
Rahtu et al.

(10) Patent No.: US 9,831,094 B2
(45) Date of Patent: *Nov. 28, 2017

(54) ENHANCED THIN FILM DEPOSITION

(71) Applicant: ASM International N.V., Almere (NL)

(72) Inventors: Antti Rahtu, Vantaa (FI); Eva Tois, Espoo (FI); Kai-Erik Elers, Vantaa (FI); Wei-Min Li, Espoo (FI)

(73) Assignee: ASM INTERNATIONAL N.V., Almere (NL)

( * ) Notice: Subject to any disclaimer, the term of this patent is extended or adjusted under 35 U.S.C. 154(b) by 129 days.

This patent is subject to a terminal disclaimer.

(21) Appl. No.: 14/812,139

(22) Filed: Jul. 29, 2015

(65) Prior Publication Data

US 2016/0118262 A1    Apr. 28, 2016

Related U.S. Application Data

(63) Continuation of application No. 13/766,469, filed on Feb. 13, 2013, now Pat. No. 9,127,351, which is a continuation of application No. 11/588,837, filed on Oct. 27, 2006, now Pat. No. 8,993,055.

(60) Provisional application No. 60/730,986, filed on Oct. 27, 2005.

(51) Int. Cl.
| | |
|---|---|
| *C23C 16/455* | (2006.01) |
| *H01L 21/285* | (2006.01) |
| *C23C 16/32* | (2006.01) |
| *H01L 21/28* | (2006.01) |
| *H01L 21/314* | (2006.01) |
| *H01L 21/316* | (2006.01) |
| *H01L 21/768* | (2006.01) |
| *H01L 21/312* | (2006.01) |

(52) U.S. Cl.
CPC ........ *H01L 21/28562* (2013.01); *C23C 16/32* (2013.01); *C23C 16/45525* (2013.01); *C23C 16/45531* (2013.01); *C23C 16/45534* (2013.01); *H01L 21/28088* (2013.01); *H01L 21/3141* (2013.01); *H01L 21/31604* (2013.01); *H01L 21/31637* (2013.01); *H01L 21/31641* (2013.01); *H01L 21/31645* (2013.01); *H01L 21/76843* (2013.01); *C23C 16/45553* (2013.01); *H01L 21/312* (2013.01)

(58) Field of Classification Search
CPC ................. C23C 16/45525; C23C 16/45527
See application file for complete search history.

(56) References Cited

U.S. PATENT DOCUMENTS

| | | | |
|---|---|---|---|
| 3,708,728 A | 1/1973 | Sterling et al. | |
| 3,925,337 A | 12/1975 | Heiberger | |
| 4,058,430 A | 11/1977 | Suntola et al. | |
| 4,282,267 A | 8/1981 | Küyel | |
| 4,389,973 A | 6/1983 | Suntola et al. | |
| 4,565,747 A | 1/1986 | Nakae et al. | |
| 4,747,367 A | 5/1988 | Posa | |
| 4,761,269 A | 8/1988 | Conger et al. | |
| 4,767,494 A | 8/1988 | Kobayashi | |
| 4,851,095 A | 7/1989 | Scobey et al. | |
| 4,935,661 A | 6/1990 | Heinecke et al. | |
| 5,071,670 A | 12/1991 | Kelly | |
| 5,166,092 A | 11/1992 | Mochizuki et al. | |
| 5,221,556 A | 6/1993 | Hawkins et al. | |
| 5,270,247 A | 12/1993 | Sakuma et al. | |
| 5,281,274 A | 1/1994 | Yoder | |
| 5,306,666 A | 4/1994 | Izumi | |
| 5,316,793 A | 5/1994 | Wallace et al. | |
| 5,342,652 A | 8/1994 | Foster et al. | |
| 5,482,262 A | 1/1996 | Hayakawa et al. | |
| 5,595,784 A | 1/1997 | Kaim et al. | |
| 5,603,771 A | 2/1997 | Seiberras et al. | |
| 5,618,395 A | 4/1997 | Gartner | |
| 5,691,235 A | 11/1997 | Meikle et al. | |
| 5,693,139 A | 12/1997 | Nishizawa et al. | |
| 5,711,811 A | 1/1998 | Suntola et al. | |
| 5,723,384 A | 3/1998 | Park et al. | |

(Continued)

FOREIGN PATENT DOCUMENTS

| | | |
|---|---|---|
| EP | 0394054 | 4/1989 |
| EP | 0387403 | 10/1989 |

(Continued)

OTHER PUBLICATIONS

Edelmann, Frank T., "Lanthanide amidinates and guanidinates in catalysis and materials science: a continuing success story". Chem. Soc. Rev., 2012, 41, 7657-7672.*

Xiang, Jinjuan, et al., "Investigation of Thermal Atomic Layer Deposited TaAlC with Low Effective Work-Function on HfO2 Dielectric Using TaCl5 and TEA as Precursors". ECS Journal of Solid State Science and Technology, 6 (1) p. 38-p. 41 (2017).*

Li, Jinwang, et al., "Mechanism and Kinetics of Aluminum Nitride Powder Degradation in Moist Air". J. Am. Ceram. Soc., 89 [3] 937-943 (2006).*

(Continued)

*Primary Examiner* — Bret Chen
(74) *Attorney, Agent, or Firm* — Knobbe, Martens, Olson & Bear LLP

(57) ABSTRACT

Methods of producing metal-containing thin films with low impurity contents on a substrate by atomic layer deposition (ALD) are provided. The methods preferably comprise contacting a substrate with alternating and sequential pulses of a metal source chemical, a second source chemical and a deposition enhancing agent. The deposition enhancing agent is preferably selected from the group consisting of hydrocarbons, hydrogen, hydrogen plasma, hydrogen radicals, silanes, germanium compounds, nitrogen compounds, and boron compounds. In some embodiments, the deposition-enhancing agent reacts with halide contaminants in the growing thin film, improving film properties.

14 Claims, 4 Drawing Sheets

(56) References Cited

U.S. PATENT DOCUMENTS

| | | | |
|---|---|---|---|
| 5,744,254 A | 4/1998 | Kampe et al. |
| 5,769,950 A | 6/1998 | Takasu et al. |
| 5,789,024 A | 8/1998 | Levy et al. |
| 5,855,680 A | 1/1999 | Soininen |
| 5,916,365 A | 6/1999 | Sherman |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo et al. |
| 5,973,400 A | 10/1999 | Murakami et al. |
| 6,006,763 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,416,577 B1 | 7/2002 | Suntola et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,632,595 B2 | 10/2003 | Kikuchi et al. |
| 6,652,924 B2 | 11/2003 | Sherman |
| 6,706,115 B2 | 3/2004 | Leskela et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,863,727 B1 | 3/2005 | Elers et al. |
| 6,902,763 B1 | 6/2005 | Elers et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,138,336 B2 | 11/2006 | Lee et al. |
| 7,211,144 B2 | 5/2007 | Lu et al. |
| 7,211,508 B2 | 5/2007 | Chung et al. |
| 7,268,078 B2 | 9/2007 | Iyer |
| 7,405,158 B2 | 7/2008 | Lai et al. |
| 7,416,981 B2 | 8/2008 | Lee et al. |
| 7,595,263 B2 | 9/2009 | Chung et al. |
| 8,841,182 B1 | 9/2014 | Chen et al. |
| 8,846,550 B1 | 9/2014 | Shero et al. |
| 9,111,749 B2 | 8/2015 | Shero et al. |
| 9,127,351 B2 * | 9/2015 | Rahtu ............... C23C 16/32 |
| 9,236,247 B2 | 1/2016 | Chen et al. |
| 2001/0024387 A1* | 9/2001 | Raaijmakers ..... H01L 21/02159 |
| | | 365/200 |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0182320 A1 | 12/2002 | Leskela et al. |
| 2003/0026989 A1 | 2/2003 | George et al. |
| 2003/0031793 A1 | 2/2003 | Chang et al. |
| 2003/0049931 A1 | 3/2003 | Byun et al. |
| 2003/0072975 A1 | 4/2003 | Shero et al. |
| 2003/0082296 A1 | 5/2003 | Elers et al. |
| 2003/0102691 A1 | 6/2003 | Schlecht et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0165615 A1* | 9/2003 | Aaltonen ............... B82Y 25/00 |
| | | 427/79 |
| 2003/0181035 A1 | 9/2003 | Yoon et al. |
| 2003/0194825 A1 | 10/2003 | Law et al. |
| 2003/0203616 A1 | 10/2003 | Chung et al. |
| 2003/0207593 A1 | 11/2003 | Derderian et al. |
| 2004/0130029 A1 | 7/2004 | Raaijmakers et al. |
| 2004/0185183 A1 | 9/2004 | Srinivasan et al. |
| 2004/0198025 A1* | 10/2004 | Derderian ............... C23C 16/06 |
| | | 438/476 |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2005/0004386 A1 | 1/2005 | Deschler et al. |
| 2005/0037557 A1 | 2/2005 | Doczy et al. |
| 2005/0106877 A1 | 5/2005 | Elers et al. |
| 2005/0215008 A1 | 9/2005 | Orlowski et al. |
| 2005/0271813 A1 | 12/2005 | Kher et al. |
| 2006/0019494 A1 | 1/2006 | Cao et al. |
| 2006/0079090 A1 | 4/2006 | Elers et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0240187 A1 | 10/2006 | Weidman |
| 2007/0037391 A1* | 2/2007 | Thompson ............... C23C 16/18 |
| | | 438/680 |
| 2007/0054046 A1 | 3/2007 | Ishizaka et al. |
| 2007/0148350 A1 | 6/2007 | Rahtu et al. |
| 2007/0190780 A1 | 8/2007 | Chung et al. |
| 2007/0218670 A1 | 9/2007 | Ishizaka |
| 2008/0102204 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |
| 2009/0081868 A1 | 3/2009 | Shah et al. |
| 2009/0315093 A1 | 12/2009 | Li et al. |
| 2009/0321936 A1 | 12/2009 | Kojima et al. |
| 2013/0078454 A1 | 3/2013 | Thompson et al. |
| 2014/0051261 A1 | 2/2014 | Ota et al. |

FOREIGN PATENT DOCUMENTS

| | | |
|---|---|---|
| EP | 0442490 | 8/1991 |
| EP | 0528779 | 2/1993 |
| EP | 0573033 | 6/1993 |
| EP | 0526779 | 10/1995 |
| EP | 0774533 | 10/1996 |
| EP | 0899779 | 3/1999 |
| EP | 1 158 070 | 11/2001 |
| EP | 1167567 | 1/2002 |
| JP | 58033841 | 2/1983 |
| JP | 6037041 | 2/1994 |
| JP | 6069157 | 3/1994 |

(56) References Cited

FOREIGN PATENT DOCUMENTS

| JP | 7230957 | 8/1995 |
|---|---|---|
| JP | 8264530 | 10/1996 |
| JP | 09/087857 | 3/1997 |
| KR | 2001-88044 | 12/2001 |
| KR | 2002-31160 | 6/2002 |
| KR | 2002-87192 | 12/2002 |
| KR | 2003-5727 | 1/2003 |
| KR | 2003-0016346 | 2/2003 |
| KR | 2003-14115 | 3/2003 |
| KR | 2003-14117 | 3/2003 |
| KR | 2003-33234 | 5/2003 |
| KR | 2003-40758 | 6/2003 |
| KR | 2003-0057938 | 7/2003 |
| KR | 2003-0093575 | 12/2003 |
| KR | 2004-0060402 | 7/2004 |
| KR | 2004-0100767 | 12/2004 |
| KR | 2005-0000168 | 1/2005 |
| TW | 200818395 | 4/2008 |
| TW | 201250044 | 12/2012 |
| WO | WO 96/17107 | 6/1996 |
| WO | WO 96/18756 | 6/1996 |
| WO | WO 98/51838 | 11/1998 |
| WO | WO 99/37655 | 7/1999 |
| WO | WO 00/01006 | 1/2000 |
| WO | WO 00/04704 | 1/2000 |
| WO | WO 00/40772 | 7/2000 |
| WO | WO 00/47404 | 8/2000 |
| WO | WO 00/47796 | 8/2000 |
| WO | WO 00/54320 | 9/2000 |
| WO | WO 00/55895 | 9/2000 |
| WO | WO 00/63957 | 10/2000 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/53565 | 7/2001 |
| WO | WO 01/66832 | 9/2001 |
| WO | WO 01/78213 | 10/2001 |
| WO | WO 01/88972 | 11/2001 |
| WO | WO 2004/077515 | 9/2004 |
| WO | WO 2006/080782 | 8/2006 |
| WO | WO 2007/041089 | 4/2007 |
| WO | WO 2008/137399 | 11/2008 |

OTHER PUBLICATIONS

Yoshida, S., "A new doping method using metalorganics in chemical vapor deposition of 6H-SiC". J. Appl. Phys. 55(1), Jan. 1, 1984, pp. 169-171.*
1988RD-0296076 (Nov. 20, 1998), Field effect transistor structure with improved transconductant—contg. spacer-less conducting gate oxide, and tungsten deposited on source and drain, East Version 2,0.1.4 Patent-Assignee: Anonymous[ANON9 , Sep. 19, 2005.
Aarik et al., "Influence of substrate temperature on atomic layer growth and properties of HfO2 thin films", Thin Solid Films, vol. 340, 1999, pp. 110-116.
Alen et al., "Atomic Layer Deposition of Ta(AI)N(C) Thin Films Using Trimethylaluminum as a Reducing Agent", Journal of the Electrochemical Society, vol. 148, No. 10, pp. G566-G571, 2001.
Andricacos et al., Damascene copper electroplating for chip, IBM Jour. Research and Dev., 1998, vol. 42, Issue 5, pp. 567-574.
Bain et al., Deposition of tungsten by plasma enhanced chemical vapour deposition, J. Phys. IV France, 1999, vol. 9, pp. 827-833.
Chang et al, "Chemical Vapor Deposition of Tantalum Carbide and Carbonitride Thin Films from Me3CE=Ta(CH2CMe3)3 (E = CH, N)," J. Mater, Chem. 13:365-369 (2003).
Elers et al., NbC15 as a precursor in atomic layer epitaxy, Applied Surface Science, Jul. 9, 1994, vol. 82/83, pp. 468-474.
Favis et al., Atomic layer epitaxy of silicon, silicon/germanium and silicon carbide via extraction/exchange processes, Avail. NTIS. Report, 1991, pp. 33.

Fuyuki et al., Atomic layer epitaxy controlled by surface superstructures in silicon carbide, Thin Solid Films, 1993, vol. 225, Issue 1-2, pp. 225-229.
Fuyuki et al., Atomic layer epitaxy of cubic silicon carbide by gas source MBE using surface superstructure, J. Cryst. Growth, 1989, vol. 95, Issue 1-4, pp. 461-463.
Girolami et al., Tailored Organometallics as Low-Temperature CVD Precursors to Thin Films, Materials Research Society Symposium Proceedings, 1988, vol. 121, pp. 429-438.
Gordon et al., "A Kinetic Model for Step Coverage by Atomic Layer Deposition in Narrow Holes or Trenches", Chemical Vapor Deposition, 2003, vol. 9, No. 2, pp. 73-78.
Hara et al., Atomic layer control of .beta.—silicon carbide (001) surface, Springer Proc. Phys., 1992, pp. 90-95.
Hiltunen et al., Nitrides of titanium, niobium, tantalum and molybdenum grown as thin films by the atomic layer epitaxy method, Thin Solid Films, 1988, vol. 166, pp. 149-154.
Hultman et al., "Review of the Thermal and Mechanical Stability of TiN-based Thin Films" Zeitscrift Fur Metallkunde 90 (10): 803-813 (1999).
Ihanus et al., "ALE growth of $ZnS_{1-x}Se_x$ thin films by substituting surface sulfur with elemental selenium," Appl. Surface Sci., 112:154-158 (1997).
International Search Report and Written Opinion dated Apr. 7, 2008, Application No. PCT/US2007/082131.
Jehn et al., Gmelin Handbook of Inorganic and Organometallic Chemistry, 8th Edition, 1993, vol. A 5b, Issue 54, pp. 131-154.
Jeon et al., A Study on the Characteristics of TiN Thin Film Deposited by Atomic Layer Chemical Vapor Deposition Method, J. Vac .Sci. Technol. A, 2000, vol. 18, Issue 4, pp. 1595-1598.
Juppo et al., Deposition of copper films by an alternate supply of CuCI and Zn, J. Vac. Sci. Technol A, Jul./Aug. 1997, vol. 15, Issue 4, pp. 2330-2333.
Kattelus et al., "Electrical Properties of Tantalum Based Composite Oxide Films," Mat. Res. Soc. Symp. Proc. vol. 284, pp. 511-516 (1993).
Kattelus et al., "Layered tantalum-aluminum oxide films deposited by atomic layer epitaxy," Thin Solid Films, Vo. 225, pp. 296-298 (1993).
Kim et al., "Novel capacitor technology for high density stand-alone and embedded DRAMs," ieee International Electron Devices Meeting, IEDM (2000).
Kim et al., Atomic-layer-depositied WNxCy thin films as diffusion barrier for copper metallization, Applied Physics Letters, Jun. 23, 2003, vol. 82, Issue 25, pp. 4486-4488.
Kirk-Othmer, Encyclopedia of Chemical Technology, John Wiley & Sons, Inc., 1992, vol. 4, pp. 841-878.
Klaus et al., Atomic layer deposition of tungsten and tungsten nitride using sequential surface reactions, AVS $46^{th}$ International Symposium, 1999, Seattle, WA, US.
Klaus et al., Atomic Layer Deposition of Tungsten Nitride Films Using Sequential Surface Reactions, Journal of the Electrochemical Society, 2000, vol. 147, Issue 3, pp. 1175-1181.
Klaus et al., Atomic layer deposition of tungsten using sequential surface chemistry with a sacrificial stripping reaction, Thin Solid Films, 2000, vol. 360, pp. 145-153.
Klaus et al., Atomically controlled growth of tungsten and tungsten nitride using sequential surface reactions, Applied Surface Science, 2000, vol. 162-163, pp. 479-491.
Klug et al. "Atomic Layer Deposition of Amorphous Niobium Carbide-Based Thin Film Superconductors". Journal of Physical Chemistry C, 2011, 115, 25063-25071.
Kukli et al,, Properties of $(Nb_{1-x}Ta_x)_2 O_5$ Solid Solutions and $(Nb_{1-x}Ta_x)_2 O_5 . ZrO_2$ Nanolaminates Growth by Atomic Layer Epitaxy, NanoStructured Materials, 1997, vol. 8, pp. 785-793.
Lai et al., Precursors for Organometallic Chemical Vapor Deposition of Tungsten Carbide Films, Chem. Mater., 1995, vol. 7, pp. 2284-2292.
Lakomaa et al., "Surface reactions in $Al_2 O_3$ growth from trimethylaluminum and water by atomic layer epitaxy," Applied Surface Science, vol. 107, pp. 107-115 (1996).
Leskeläet al., ALD precursor chemistry: Evolution and future challenges, Jour. Phys. IV France 9, 1999, pp. 837-852.

(56) References Cited

OTHER PUBLICATIONS

Ludviksson et al., Low-Temperature Thermal CVD of Ti—Al Metal Films Using a Strong Reducing Agent, Chem. Vap. Deposition, 1998, vol. 4, Issue 4, pp. 129-132.

Martensson et al., Atomic Layer Epitaxy of Copper and Tantalum, Chemical Vapor Deposition, 1997, vol. 3, Issue 1, pp. 45-50.

Martensson et al., Cu(THD)$_2$ As Copper Source in Atomic Layer Epitaxy, Electrochemical Society Proceedings, vol. 97-25, (1997) pp. 1529-1536.

Martensson, Use of atomic layer epitaxy for fabrication of Si/TiN/Cu structures, J. Vac. Sci. Technol. B, Sep./Oct. 1999, vol. 17, Issue 5, pp. 2122-2128.

Matsunami et al., Hetero-interface control and atomic layer epitaxy of SiC, Applied Surface Science, 1997, vol. 112, pp. 171-175.

Min et al., Atomic Layer Deposition of TiN Films by Alternate Supply of Tetrakis (ethylmethylamino)—Titanium and Ammonia, Jpn. J. Appl. Phys., 1998, vol. 37, pp. 4999-5004.

Min et al., Atomic Layer Deposition of TiN Thin Films by Sequential Introduction of Ti Precursor and HN$_3$, Mat. Res. Soc. Symp. Proc., 1998, vol. 514, pp. 337-342.

Nakajima et al., Chemical Vapor Deposition of Tungsten Carbide, Molybdenum Carbide Nitride, and Molybdenum Nitride Films, J. Electrochem. Soc., Jun. 1997, vol. 144, Issue 6, pp. 2096-2100.

Notice of Allowance for U.S. Appl. No. 10/242,368 dated Jul. 19, 2005.

Notice of Allowance for U.S. Appl. No. 10/969,297 dated Sep. 18, 2007.

Notice of Allowance for U.S. Appl. No. 11/591,845 dated Sep. 4, 2009.

Office Action for U.S. Appl. No. 10/049,125 dated Apr. 8, 2004.
Office Action for U.S. Appl. No. 10/049,125 dated Jun. 18, 2003.
Office Action for U.S. Appl. No. 10/049,125 dated Oct. 27, 2003.
Office Action for U.S. Appl. No. 10/242,368 dated Apr. 27, 2004.
Office Action for U.S. Appl. No. 10/242,368 dated Oct. 20, 2004.
Office Action for U.S. Appl. No. 10/969,297 dated Apr. 12, 2007.
Office Action for U.S. Appl. No. 10/969,297 dated Oct. 11, 2006.
Office Action for U.S. Appl. No. 11/286,203 dated Sep. 28, 2007.
Office Action for U.S. Appl. No. 11/288,872 dated Jan. 30, 2008.
Office Action for U.S. Appl. No. 11/288,872 dated Jul. 2, 2007.
Office Action for U.S. Appl. No. 11/288,872 dated Aug. 20, 2009.
Office Action for U.S. Appl. No. 11/288,872 dated Sep. 9, 2008.
Office Action for U.S. Appl. No. 11/288,872 dated Dec. 4, 2008.
Office Action for U.S. Appl. No. 11/591,845 dated May 28, 2009.
Office Action for U.S. Appl. No. 11/591,845 dated Sep. 4, 2008.

Polyakov et al., Growth of GaBN Ternary Soloutions by Organometallic Vapor Phase Epitaxy, Journal of Electronic Materials, 1997, vol. 26, Issue 3, pp. 237-242.

Ritala et al., "Controlled Growth of TaN, Ta3N5, and TaOxNy Thin Films by Atomic Layer Deposition", Chem. Mater., 1999, vol. 11, pp. 1712-1718.

Ritala et al., Atomic Layer Epitaxy Growth of TiN Thin Films from TiI$_4$ and NH$_3$, J. Electrochem. Soc., Aug. 1998, vol. 145, Issue 8, pp. 2914-2920.

Ritala et al., Atomic layer epitaxy growth of TiN thin films, J. Electrochem. Soc., 1995, vol. 142, Issue 8, pp. 2731-2737.

Ritala et al., Effects of intermediate zinc pulses on properties of TiN and NbN films deposited by atomic layer epitaxy, Appl. Surf. Sci., 1997, vol. 120, pp. 199-212.

Ritala et al., Perfectly conformal TiN and Al2O3 films deposited by atomic layer deposition, Chem. Vapor Deposition, 1999, vol. 5, pp. 7-9.

Ritala et al., Surface roughness reduction in atomic layer epitaxy grown of titanium dioxide thin films, Thin Solid Films, vol. 249, pp. 155-162 (1994).

Sadayuki et al., Sub-atomic layer growth of SiC at low temperatures, Japanese Journal of Applied Physics, 1995, vol. 34, Issue 11, pp. 6166-6170.

Sherman et al., Plasma enhanced atomic layer deposition of Ta for diffusion barrier applications, AVS 46$^{th}$ International Symposium, Oct. 26, 1999, Seattle, WA, US.

Song et al., "Formation of Tantalum Carbide and Nitride Phases in Atomic Layer Deposition Using Hydrogen Plasm and tert-Butylimido-tris(diethylamido)-tantalum (TBTDET), and its Effect on Material Properties", Chemical Vapor Deposition, 2008, vol. 14, pp. 334-338.

Suntola, "Atomic Layer Epitaxy," Handbook of Crystal Growth 3, Ch. 14, pp. 601-663 (1994).

Tulhoff et al., Ullmann's Encyclopedia of Industrial Chemistry, 5$^{th}$, Completely Revised Edition, 1986, vol. A5, pp. 61-77.

Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).

Wong et al., Barriers for copper interconnections, Solid State Technology, 1999, pp. 1-7.

Yang et al., Atomic Layer Deposition of Tungsten Film from WF6/B2H6: Nucleation Layer for Advanced Semiconductor Devices, Advanced Metallization Conference 2001 (AMC 2001), Conference Proceedings ULSI XVII@2002 Materials Research Society, 2001, pp. 655-660.

Zhang et al., "High permittivity thin film nanolaminates," Journal of Applied Physics, vol. 87, No. 4, pp. 1921-1924 (2000).

\* cited by examiner

ENHANCED THIN FILM DEPOSITION

REFERENCE TO RELATED APPLICATIONS

The present application claims priority as a continuation of U.S. application Ser. No. 13/766,469, filed Feb. 13, 2013, now U.S. Pat. No. 9,127,351, which in turn claims priority to U.S. application Ser. No. 11/588,837, filed Oct. 27, 2006, now U.S. Pat. No. 8,993,055, which in turn claims priority to U.S. Provisional application No. 60/730,986, filed Oct. 27, 2005. Each of the priority applications are incorporated by reference herein.

BACKGROUND OF THE INVENTION

Field of the Invention

The present invention relates generally to processes for producing thin films with low impurity contents on a substrate by atomic layer deposition. In some embodiments, the films produced by the atomic layer deposition (ALD) processes disclosed herein can be used in metal gate and metal electrode applications in metal oxide semiconductor field effect transistors (MOSFETs) or as barrier layers in interconnect structures.

Description of the Related Art

Atomic layer deposition (ALD) is a self-limiting process, whereby alternated pulses of reaction precursors saturate a substrate surface and leave no more than one monolayer of material per pulse. The deposition conditions and precursors are selected to ensure self-saturating reactions, such that an adsorbed layer in one pulse leaves a surface termination that is non-reactive with the gas phase reactants of the same pulse. A subsequent pulse of different reactants reacts with the previous termination to enable continued deposition. Thus, each cycle of alternated pulses leaves no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, the disclosure of which is incorporated herein by reference.

In a typical ALD process for depositing thin films, one deposition cycle comprises exposing the substrate to a first precursor, removing unreacted first reactant and reaction byproducts from the reaction chamber, exposing the substrate to a second precursor, followed by a second removal step. Typically, halide precursors, such as $TiCl_4$ and $HfCl_4$, are used as precursors in ALD deposition because those precursors are inexpensive and relatively stable, but at the same time reactive towards different types of surface groups. $H_2O$ and $NH_3$ are widely used for oxide and nitride deposition, respectively, as second precursors.

ALD processes typically produce thin films that have lower impurity content at the same deposition temperature than chemical vapor deposition (CVD) processes. Despite the lower impurity levels in ALD films, the impurity content in ALD films can still be a problem. There are several possible reasons for the presence of impurities in thin films deposited by ALD. In some cases, the semiconductor process flow necessarily limits the maximum deposition temperature such that that some residues are left in the film. ALD films deposited from chloride or other halide-containing precursors (e.g., $WF_6$) at relatively low temperatures can comprise relatively high levels of halide residues. Halide impurities are present mainly at the interfaces, which can also lead to problems. In some cases, like low temperature deposition of transition metal nitrides and transition metal carbides from halide containing precursors the, impurity contents can be above the acceptable limit for some integrated circuit (IC) applications. In another example, in some applications amorphous films are needed, which limits the growth temperature.

Another disadvantage of the residues remaining in the film as it is deposited is that they may block the growth and result in a lower growth rate. For example, a high growth temperature may be chosen because the films are impure at low temperatures. However, the number of reactive active sites, such as —OH or $NH_x$ groups, is higher at low temperatures As a result, the growth rate is substantially lowered by impurities.

U.S. Patent Application No. 2004/0208994 to Harkonen et al. describes a method for ALD deposition of carbon-containing transition metal films. As an example, Harkonen et al. deposited carbon containing titanium films (example 1B) at a deposition temperature of about 500° C. using $TiCl_4$ and trimethylaluminum (TMA) as precursors. The disadvantage of this process is that it needs a substantially high deposition temperature in order to achieve low impurity contents, chlorine in their case. Furthermore, it is widely known in art that TMA will decompose when used at such high temperatures. By decomposing TMA, the uniqueness of ALD, i.e., saturated and surface controlled reactions, which leads to superb conformality and uniformity of ultra-thin films over the large-area substrates, may be lost. If the same carbon containing titanium film process is performed at temperatures below the decomposition temperature of TMA, for example at 350° C., the chlorine content of the film will be undesirably high.

Accordingly, there is a need in the art for a low temperature ALD method for producing metal-containing films from halide (e.g., chlorine) containing metal precursors at low temperatures and with low halogen impurity levels in the films.

SUMMARY OF THE INVENTION

According to some embodiments of the invention, a deposition-enhancing agent is utilized in ALD processes for depositing a metal or silicon-containing film from a halide-containing precursor. In a preferred embodiment, the deposition-enhancing agent is selected from the group consisting of hydrocarbons, hydrogen, hydrogen plasma, hydrogen radicals, silanes, germanium compounds, nitrogen compounds, boron compounds and boranes. In a more preferred embodiment, the deposition-enhancing agent is a hydrocarbon, preferably a hydrocarbon selected from the group consisting of alkanes, alkenes and alkynes. The deposition enhancing agent may be provided in each ALD cycle, or at intervals during the deposition process.

In one embodiment of the invention, atomic layer deposition (ALD) processes for forming a metal-carbide thin film are disclosed. The processes preferably comprise contacting a substrate in a reaction space with alternating and sequential pulses of a metal source chemical that comprises at least one halide ligand, a second source chemical comprising a metal and carbon and a third source chemical, wherein the third source chemical is a deposition-enhancing agent. In one embodiment, the deposition enhancing agent is a hydrocarbon, preferably acetylene. The second source chemical may comprise an organic ligand, and in one embodiment is preferably TMA or TEA (triethylaluminum).

In another embodiment, ALD processes for forming a metal carbide film are disclosed, in which alternating and self-saturating pulses of reactants are provided in a plurality of deposition cycles. Each cycle preferably comprises contacting a substrate in a reaction space with alternating and sequential pulses of a first metal source chemical, preferably a halide compound, a second source chemical comprising carbon, and a third source chemical, wherein the third source chemical is a hydrocarbon. The third source chemical is preferably selected from the group consisting of alkanes, alkenes and alkynes and in one embodiment is acetylene.

In still another embodiment of the invention, atomic layer deposition (ALD) processes for forming oxygen-containing thin films on a substrate are disclosed. The processes preferably comprise contacting the substrate with alternating and sequential pulses of a metal reactant, a second reactant comprising an oxygen source and a deposition-enhancing agent. The metal reactant is preferably a halide and typically comprises a metal selected from the group consisting of Ti, Zr, Hf, V, Nb, Ta, Cr, Mo, W and Al. The deposition enhancing agent is preferably a hydrocarbon, such as acetylene. The oxygen source may be, for example, $H_2O$, $O_2$, ozone, oxygen radicals or oxygen plasma.

In yet another embodiment of the invention, atomic layer deposition (ALD) processes for forming elemental thin films on a substrate are disclosed. The processes preferably comprise contacting the substrate with alternating and sequential pulses of a metal a deposition-enhancing agent, a metal source chemical and a reducing agent. The reducing agent is preferably selected from the group consisting of boranes and silanes. The deposition enhancing agent may be, for example, a boron compound such as triethyl boron (TEB).

In yet another embodiment of the invention, atomic layer deposition (ALD) processes for forming a silicon-containing thin film, such as a metal silicide, on a substrate are disclosed. The processes preferably comprise contacting the substrate with alternating and sequential pulses of a metal source chemical, a silicon source chemical and a deposition-enhancing agent. The silicon source chemical may be, for example, a silane. In one embodiment the deposition enhancing agent is a boron compound, such as TEB.

In yet another embodiment of the invention, a semiconductor device structure is disclosed. The structure comprises a substrate and a thin film layer overlying the substrate, wherein the thin film layer is formed by atomic layer deposition (ALD) by contacting the substrate with alternating and sequential pulses of a metal source chemical, an oxygen, nitrogen, carbon, or silicon source chemical, and a deposition-enhancing agent.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENT

Figure 1:
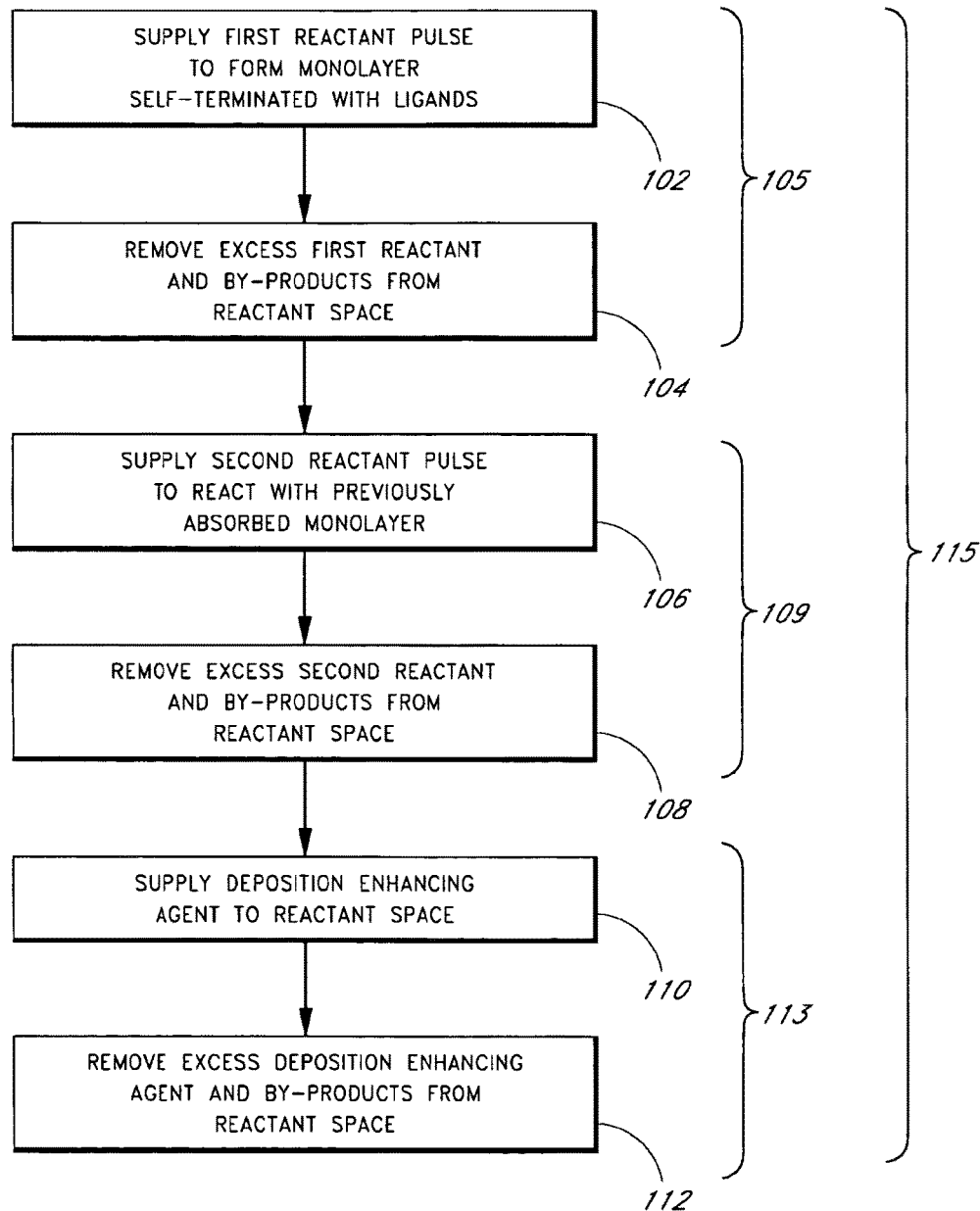
FIG. 1 is a flow chart generally illustrating a method of forming a binary compound by atomic layer deposition (ALD), in which supply of a deposition-enhancing agent follows removal of excess second reactant and by-products, in accordance with preferred embodiments of the invention.
Figure 2:
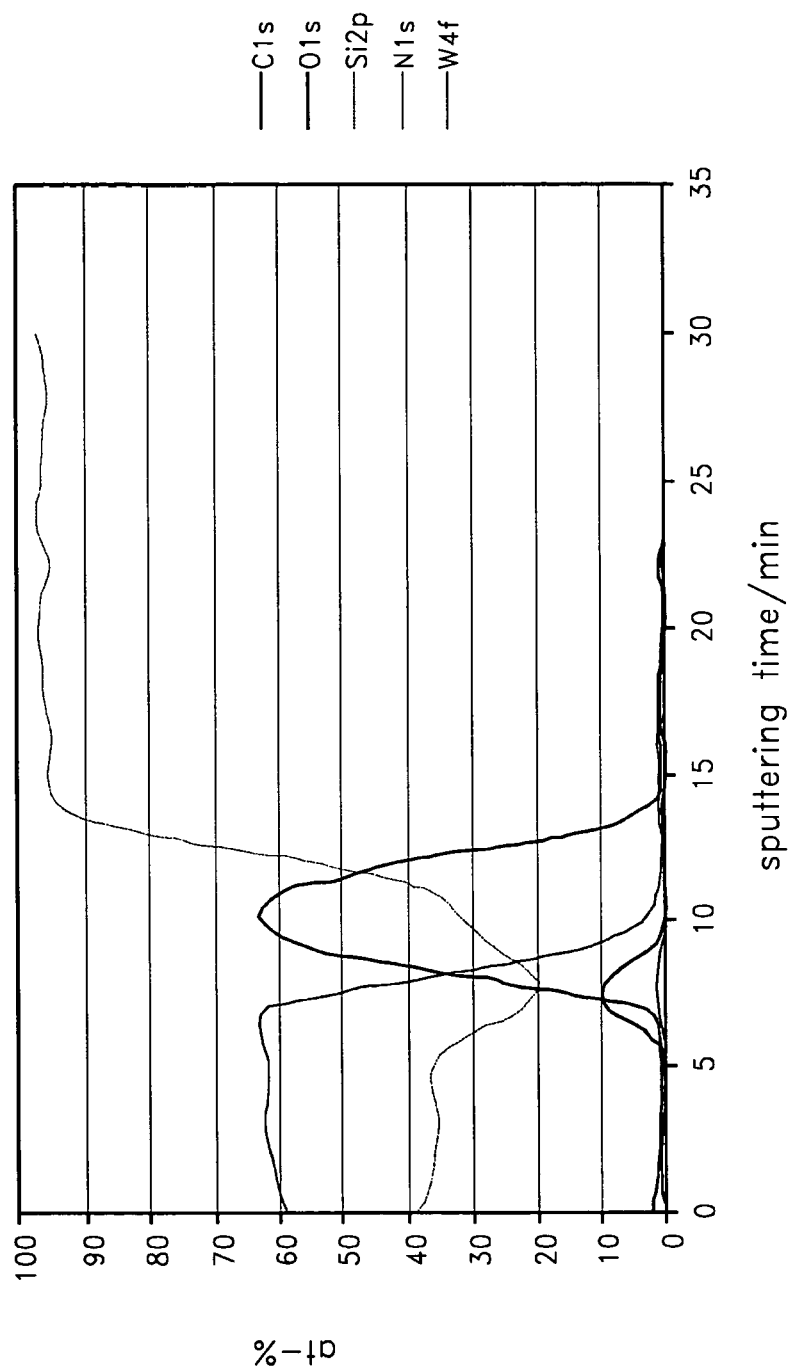
FIG. 2 is an x-ray photoelectron spectroscopy (XPS) sputtering time profile of a highly conductive tungsten silicide ($WSi_x$) film formed with pulsing sequence $WF_6/N_2/Si_2H_6/N2/TEB/N_2$.

The present invention advantageously enables thin film formation at lower temperatures with reduced impurity levels by employing a deposition enhancing agent. In some preferred embodiments, the deposition enhancing agents are hydrocarbons, more preferably unsaturated hydrocarbons such as alkanes, alkenes and alkynes.

Definitions

In context of the present invention, "an ALD process" generally refers to a process for producing thin films over a substrate in which a thin film is formed molecular layer by molecular layer due to self-saturating chemical reactions. The general principles of ALD are disclosed, e.g., in U.S. Pat. Nos. 4,058,430 and 5,711,811, the disclosures of which are incorporated herein by reference. In an ALD process, gaseous reactants, i.e., precursors, are conducted into a reaction chamber of an ALD type reactor where they contact a substrate located in the chamber to provide a surface reaction. The pressure and the temperature of the reaction chamber are adjusted to a range where physisorption (i.e. condensation of gases) and thermal decomposition of the precursors are avoided. Consequently, only up to one monolayer (i.e. an atomic layer or a molecular layer) of material is deposited at a time during each pulsing cycle. The actual growth rate of the thin film, which is typically presented as Å/pulsing cycle, depends, for example, on the number of available reactive surface sites or active sites on the surface and bulkiness of the chemisorbing molecules. Gas phase reactions between precursors and any undesired reactions of by-products are inhibited because precursor pulses are separated from each other by time and the reaction chamber is purged with an inactive gas (e.g. nitrogen or argon) and/or evacuated using, e.g., a pump between precursor pulses to remove surplus gaseous reactants and reaction by-products from the chamber.

"Reaction space" is used to designate a reactor or reaction chamber, or an arbitrarily defined volume therein, in which conditions can be adjusted to effect thin film growth by ALD. Typically the reaction space includes surfaces subject to all reaction gas pulses from which gases or particles can flow to the substrate, by entrained flow or diffusion, during normal operation. The reaction space can be, for example, in a single-wafer ALD reactor or a batch ALD reactor, where deposition on multiple substrates takes place at the same time.

"Adsorption" is used to designate a chemical attachment of atoms or molecules on a surface.

"Surface" is used to designate a boundary between the reaction space and a feature of a substrate.

"Thin film" means a film that is grown from elements or compounds that are transported as separate ions, atoms or molecules via vacuum, gaseous phase or liquid phase from the source to the substrate. The thickness of the film depends upon the application and may vary in a wide range, preferably from one atomic layer to 1,000 nm or more. In some embodiments, the thin film is less than about 20 nm in thickness, even more preferably less than about 10 nm and most preferably less than about 5 nm.

"Metallic thin film" designates a thin film that comprises metal. A metallic thin film may be an elemental metal thin film comprised essentially of elemental metal. Depending on the reducing agent, the elemental metal thin film may contain some metal carbide, metal nitride and/or metal oxide in an amount that does not have a negative effect on the characteristic metal properties of the film. In addition, a metallic thin film may be a compound metal thin film comprised essentially of compound metal, such as metal oxide, metal nitride, metal carbide, metal silicon compound, or metal nitride carbide (e.g., $WN_xC_y$).

Subscripts "x" and "y" are used to designate species that are not necessarily stoichiometric, having a wide range of phases with varying metal/oxygen, metal/carbon, metal/nitrogen, or metal/carbon/nitrogen ratios.

Preferred ALD Methods

The methods presented herein allow deposition of conformal thin films on substrate surfaces. In preferred embodiments, thin films are deposited from halogen-containing chemicals. Geometrically challenging applications are also possible due to the self-limited nature of the surface reactions.

According to the preferred embodiments, an atomic layer deposition (ALD) type process is used to form thin films, preferably metallic thin films, on substrates, such as integrated circuit workpieces. The surfaces on which the thin films are deposited can take a variety of forms. Examples include, but are not limited to, silicon, silicon oxide ($SiO_2$), coated silicon, dielectric materials, low-k materials, metals such as copper and aluminum, metal alloys, metal oxides and various nitrides, such as transition metal nitrides and silicon nitride or a combination of said materials.

In a preferred embodiment of the invention, a substrate or workpiece placed in a reaction chamber is subjected to alternately repeated surface reactions. In particular, thin films are formed by repetition of a self-limiting ALD cycle. Preferably, each ALD cycle comprises at least three distinct phases. In the case of compound metallic thin film deposition, at least three different source chemicals are alternatively employed, corresponding to the three phases. One reactant will form no more than about one monolayer on the substrate surface and includes a metal species desired in the layer being deposited. This reactant, also referred to herein as "the metal reactant," is preferably a halide, and thus the deposited monolayer is terminated with halogen ligands.

A second reactant preferably contains another species desired in the layer being deposited, such as nitrogen, carbon, silicon and/or oxygen. However, in some embodiments, such as the deposition of elemental metals, the second reactant does not contribute to the growing film.

The second reactant is typically not a halide, although in some embodiments it may be. In a preferred embodiment the second reactant comprises a metal and carbon. In some embodiments, the second reactant is TMA or TEA. In other embodiments, the second reactant is water. In still other embodiments, the second reactant is a metal-containing source chemical comprising at least one ligand, such as a metalorganic compound. Further, in some embodiments the second reactant can also leave some amount of metal in the film being deposited. For example, in case of TMA or TEA, some amount of aluminum may be left in the film, depending on the particular reaction conditions.

The third reactant is preferably a deposition-enhancing agent. Preferably the deposition-enhancing agent is capable of reducing the level of contaminants in the growing film. Thus, in some embodiments the third reactant is able to remove halides from the growing film and/or from the reaction space. The third reactant may be a carbon compound, preferably one that is a strong reducer. Moreover, in some embodiments the third reactant also provides a species desired in the thin film, such as carbon, nitrogen, silicon or oxygen.

The deposition-enhancing agent is preferably selected from the group consisting of hydrocarbons, hydrogen, hydrogen plasma, hydrogen radicals, silanes, germanium compounds, nitrogen compounds, boron compounds and boranes. In a more preferred embodiment, the deposition-enhancing agent is a hydrocarbon selected from the group consisting of alkanes, alkenes and alkynes. In other embodiments the deposition-enhancing agent is triethyl boron (TEB) or acetylene ($C_2H_2$).

The deposition enhancing agent may be provided in each ALD cycle or at intervals during the deposition process. For example, in some embodiments the deposition enhancing agent is provided every one to four ALD cycles. At the time the deposition enhancing agent is provided, the film grown in the most recent ALD cycles is preferably thin enough that the deposition enhancing agent can penetrate the film. In addition, if the deposition enhancing agent comprises radicals, it is preferably provided initially at a point in the deposition process such that it is not able to penetrate the deposited film and damage the underlying substrate material.

In one phase of the ALD cycle ("the metal phase" or the "first phase"), the reactant or source chemical comprising a metal species is supplied to the reaction chamber and chemisorbs to the substrate surface. The reactant supplied in this phase is selected such that, under the preferred conditions, the amount of reactant that can be bound to the surface is determined by the number of available binding sites and by the physical size of the chemisorbed species (including ligands). The chemisorbed layer left by a pulse of the metal reactant is self-terminated with a surface that is non-reactive with the remaining chemistry of that pulse. This phenomenon is referred to herein as "self-saturation." One of skill in the art will recognize that the self-limiting nature of this phase makes the entire ALD cycle self-limiting. Excess reactant and reactant byproducts (if any) are removed from the reaction space, for example by purging with an inert gas and/or evacuation.

Maximum step coverage on the workpiece surface is obtained when no more than about a single molecular layer of metal source chemical molecules is chemisorbed in each self-limiting pulse. Due to the size of the chemisorbed species and the number of reactive sites, somewhat less than a monolayer (ML) may be deposited in each pulse of metal reactant.

In the next phase of the cycle, a pulse of a second source chemical is provided that reacts with the molecules left on the substrate surface by the preceding pulse. In some embodiments the source chemical preferably comprises a species that is to be incorporated in the thin film, such as nitrogen, oxygen, silicon or carbon. Thus, the desired species is incorporated into the thin film by the interaction of the source chemical with the monolayer left by the metal reactant. This phase is referred to herein as "the second phase" or the "species-contributing phase." In particular embodiments, the second source chemical is a silicon, nitrogen, oxygen or carbon containing compound and its reaction with the chemisorbed metal species produces a metal silicide, nitride, oxide or carbide layer on the substrate. In other embodiments the second source chemical is a metal source chemical, such as TMA, and metal is incorporated into the growing film. In some preferred embodiments the species-contributing source chemical comprises metal and carbon.

In still other embodiments the second source chemical is not incorporated in the film to any appreciable extent. For example, in some embodiments the second reactant is a reducing agent that at least partially reduces the adsorbed first reactant to an elemental metal.

Excess second source chemical and reaction byproducts, if any, are removed from the reaction space by purging and/or evacuation.

The third phase of the ALD cycle comprises providing a deposition-enhancing agent. In the preferred embodiments the deposition enhancing agent is capable of removing halides or other contaminants or undesired reaction byproducts from the growing thin film and/or from the reaction chamber. In addition, the deposition-enhancing agent may comprise a species that may be incorporated into the thin film, such as carbon, boron or silicon. This is referred to as the "third phase" or the "deposition-enhancing phase."

Although referred to as the "first phase," the "second phase" and the "third phase," these labels are for convenience and do not indicate the actual order of the phases in each ALD cycle. Thus, the initial ALD cycle may be started with any of the three phases described above. However, one of skill in the art will recognize that if the initial ALD cycle does not begin with the metal reactant phase, at least two ALD cycles will typically need to be completed to deposit about a monolayer of the desired thin film.

In addition, the order of the phases may be changed. That is, in some embodiments the deposition enhancing agent may be the next reactant provided after the second reactant, while in other embodiments the deposition enhancing agent may be the next reactant provided after the first metal source reactant. For example, in some embodiments the third phase (provision of the deposition-enhancing agent) may immediately follow the first phase (provision of the reactant comprising a metal species), which in turn is followed by the species-contributing phase. A phase is generally considered to immediately follow another phase if only a purge or other reactant removal step intervenes.

In one embodiment, an ALD cycle comprises:
1. providing a metal halide to the reaction space;
2. purging and/or evacuation of excess transition metal halide and reaction byproducts;
3. providing a second reactant to the reaction space;
4. purging/and or evacuation of excess second reactant and reaction byproduts; and
5. providing a deposition-enhancing agent to the reaction space.

Step 5 can be included in each ALD cycle, or steps 1-4 can be repeated several times before step 5 is introduced. In some embodiments steps 1-4 are repeated up to 10 times before step 5 is included. In other embodiments steps 1-4 are repeated up to 100 or even 1000 or more times before step 5 is included.

With reference to FIG. 1, in an embodiment of the invention, after initial surface termination, if necessary, a first reactant or source chemical pulse is supplied 102 to the substrate or workpiece. In accordance with a preferred embodiment, the first reactant pulse comprises a carrier gas flow and a volatile halide species that is reactive with the workpiece surfaces of interest and further comprises a species that is to form part of the deposited layer. Accordingly, a halogen-containing species adsorbs upon the workpiece surfaces. In the illustrated embodiment, the first reactant is a metal halide, and the thin film being formed comprises a metallic material, preferably metal nitride, metal carbide, a metal silicon compound or metal oxide. The first reactant pulse self-saturates the workpiece surfaces such that any excess constituents of the first reactant pulse do not further react with the monolayer formed by this process. Self-saturation results due to halide tails terminating the monolayer, protecting the layer from further reaction.

The first reactant is then removed 104 from the reaction space. Preferably, step 104 merely entails stopping the flow of the first reactant or chemistry while continuing to flow a carrier gas for a sufficient time to diffuse or purge excess reactants and reactant byproducts from the reaction space, preferably with greater than about two reaction chamber volumes of the purge gas, more preferably with greater than about three chamber volumes. Preferably the removal 104 comprises continuing to flow purge gas for between about 0.1 seconds and 20 seconds after stopping the flow of the first reactant pulse. Inter-pulse purging is described in co-pending U.S. patent application having Ser. No. 09/392,371, filed Sep. 8, 1999 and entitled IMPROVED APPARATUS AND METHOD FOR GROWTH OF A THIN FILM, the disclosure of which is incorporated herein by reference. In other arrangements, the chamber may be pumped down between alternating chemistries. See, for example, PCT publication number WO 96/17107, published Jun. 6, 1996, entitled METHOD AND APPARATUS FOR GROWING THIN FILMS, the disclosure of which is incorporated herein by reference. Together, the adsorption 102 and reactant removal 104 represent a first phase 105 in an ALD cycle. The first phase in the illustrated ALD cycle is thus the metal phase.

With continued reference to FIG. 1, a second reactant or source chemical pulse is then supplied 106 to the workpiece. The second chemistry desirably reacts with or adsorbs upon the monolayer left by the first reactant. In the illustrated embodiment, this second reactant pulse 106 comprises supplying a carrier gas with the second source gas to the workpiece. In particular, where the first reactant comprises a metal halide, the second reactant leaves no more than about a monolayer of a metal-containing species. The second reactant preferably removes at least some halide ligands from the adsorbed first reactant. The second reactant pulse 106 also leaves a surface termination that operates to limit the deposition in a saturative reaction phase.

After a time period sufficient to completely saturate and react the monolayer with the second reactant pulse 106, any excess second reactant is removed 108 from the workpiece. As with the removal 104 of the first reactant, this step 108 preferably comprises stopping the flow of the second chemistry and continuing to flow carrier gas for a time period sufficient for excess reactants and volatile reaction by-products from the second reactant pulse to diffuse out of and be purged from the reaction space. Together, the second reactant pulse 106 and removal 108 represent a second phase 109 in the illustrated process, and can also be considered a non-metal species-contributing phase. The second phase 109 can also be considered a non-halide species-contributing phase.

When the excess reactants of the second reactant pulse have been removed 108 from the chamber, a third reactant or source chemical pulse is preferably supplied to the workpiece 110. Preferably the third reactant is a deposition-enhancing agent that is capable of removing halides from the substrate surface and/or the reaction space, such as hydrocarbons, hydrogen, hydrogen plasma, hydrogen radicals, silanes, germanium compounds, nitrogen compounds, boron compounds and boranes. The deposition-enhancing agent is preferably provided with an inert carrier gas. Temperature and pressure conditions are preferably arranged to avoid diffusion of the deposition-enhancing agent through the monolayer to underlying materials.

After a time period sufficient to completely saturate and react the monolayer with the third reactant, excess unreacted deposition-enhancing agent and any reaction by-products (preferably also volatile) are removed 112 from the reaction space, preferably by a purge gas pulse. The removal can be as described for step 104. Together, the deposition-enhancing agent pulse 110 and removal 112 represent a third phase 113 of the illustrated ALD process, which can also be referred to as the deposition-enhancing phase.

In an alternative embodiment of the invention (not shown), supply of deposition-enhancing agent immediately follows the step of removing excess first reactant and by-products. After a time period sufficient to completely saturate and react the monolayer with the deposition-enhancing agent, excess unreacted deposition-enhancing agent and reaction by-products are removed from the reaction space, preferably by a purge gas pluse. The removal step is followed by supply of the second reactant pulse.

In another alternative embodiment of the invention (not shown), the steps of supplying the deposition-enhancing agent and removing any excess deposition-enhancing agent and by-products precede the step of supplying the first reactant. In other alternative embodiments, the deposition-enhancing agent is not provided in every cycle.

The foregoing embodiments will be discussed in the context of specific thin film chemistries.

Deposition of Carbon-Containing Films

Carbon containing metal films or metal carbides have varying applications, such as gate electrodes, electrodes in capacitors and barrier layers in damascene and dual damascene structures.

In one embodiment, a general pulsing sequence for carbon-containing metal or metal carbide thin film deposition is:

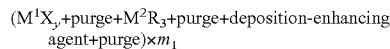

or

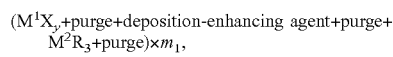

wherein $m_1$ is the number of total cycles. $M^1$ is a metal atom, preferably selected from the group consisting of Ti, Zr, Hf, V, Nb, Ta, Cr, Mo, W. However, in other embodiments $M^1$ is selected from the group consisting of Fe, Mn, Ni, Co, Cu, Zn, Cd, Ge, Si, Sn, Sb, Ga, Ru, Ir, Pd, Pt, Au, Rh, Re, B, In and Al.

$M^2$ is a metal atom, preferably selected from the group consisting of B, Al, In, Sn, Bi, Sn, Zn, Pb, Sb and Ga. R is a ligand for $M^2$ and can be any ligand, preferably a metalorganic ligand, more preferably an organometallic ligand, most preferably an alkane ligand, such as ethyl ligand.

$X_y$ is one or more ligands for $M^1$. Each X is preferably a halogen ligand selected from the group consisting of I, Br, Cl and F. However, in some embodiments at least one X can be a metalorganic ligand, such as a cyclopentadienyl (for example, cyclopentadienyl, methylcyclopentadienyl, pentamethylcyclopentadienyl, ethylcyclopentadienyl, isopropylcyclopentadienyl, tertbutylcyclopentadienyl, and indenyl), alkoxide (for example, methoxide, ethoxide, isopropoxide, and tertbutoxide), alkyl (for example, methyl, ethyl, propyl, and butyl), carbonyl, cyclo-octadiene, benzene or hydrogen ligand. In other embodiments $X_y$ may comprise mixtures thereof. However, at least one of the $X_y$ ligands is preferably a halogen. As an example, bis(cyclopentadienyl)hafnium dichloride or bis(cyclopentadienyl)tantalum(V) trichloride, can be used as a metal precursor in some embodiments.

The deposition enhancing agent is preferably selected from the group consisting of hydrocarbons, hydrogen, hydrogen plasma, hydrogen radicals, silanes, germanium compounds, nitrogen compounds, boron compounds and boranes. In a more preferred embodiment, the deposition-enhancing agent is a hydrocarbon selected from the group consisting of alkanes, alkenes and alkynes.

In preferred embodiments, $M^2$ is a metals, preferably aluminum, and R is a carbon-containing ligand. $M^2R_3$ preferably has at least one metal-to-carbon bond. In some embodiments, $M^2R_3$ may be considered a carbon source chemical.

One benefit of the present invention is that the growth rate is extremely high for an ALD process. For example, the growth rate for TaC formation can be over 2 Å/cycle. Further, annealing can be performed after the metal carbide deposition for enhancing the properties of the film. Suitable atmospheres, such as $N_2$ or forming gas ($N_2/H_2$), may be used during annealing.

Exemplary pulsing sequences for TaC film formation include:

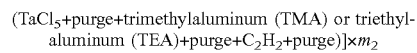

or

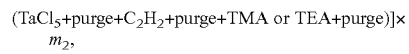

wherein $m_2$ is the number of total cycles and $C_2H_2$ is the deposition-enhancing agent.

To improve film properties, acetylene ($C_2H_2$) was introduced in the TaC formation process as a deposition-enhancing agent as described above. Films deposited using acetylene contained about 40 times less chlorine than films deposited without the use of acetylene. This minor amount of chlorine is acceptable for device structures.

In another embodiment, tungsten carbide films are deposited. An exemplary pulsing sequence may be:

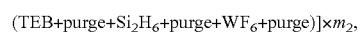

wherein $m_2$ is the number of total cycles, WF6 corresponds to $M^1X_y$, TEB is $M^2R_3$ and $Si_2H_6$ is the deposition enhancing agent.

A tungsten-carbide ($WC_x$) film could be produced in the prior art from alternating and sequential pulses of $WF_6$ and TEB. Sequential and alternating pulses of $WF_6$ and TEB at about 300° C. produce low resistivity $WC_x$ films with hydrogen and fluorine impurities. By utilizing a deposition enhancing agent in the ALD cycle described above, alternating and sequential pulses of TEB, a deposition-enhancing agent (e.g., $Si_2H_6$) and $WF_6$ at a temperature between about 200° C. and 350° C. produced $WC_x$ films with no impurities (FIG. 3) and substantially lower resistivity.

In other embodiments, a deposition-enhancing agent is not utilized every cycle but only in some of the cycles. In this situation, a general pulsing sequence for carbon-containing metal thin film deposition can be:

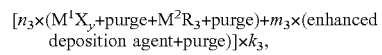

wherein $n_3$ is the number of carbide cycles in one total cycle, $m_3$ is the number of cycles in which a deposition enhancing agent is used in one total cycle, and $k_3$ is the number of total cycles. $M^1$ is a metal atom preferably selected from the group consisting of Ti, Zr, Hf, V, Nb, Ta, Cr, Mo, W, Si and Al. In other embodiments M$^1$ can be selected from the group consisting of Fe, Mn, Ni, Co, Cu, Zn, Cd, Ge, Si, Sn, Sb, Ga, Ru, Ir, Pd, Pt, Au, Rh, Re, B, In. M$^2$ is a metal atom, preferably selected from the group consisting of B, Al, In, Sn, Bi, Zn, Pb, Sb and Ga. R is a ligand for M$^2$ and can be any ligand.

X$_y$ is one or more ligands for M$^1$. Each X is preferably a halogen ligand selected from the group consisting of I, Br, Cl and F. However, in some embodiments at least one X can be a metalorganic ligand, such as a cyclopentadienyl (for example, cyclopentadienyl, methylcyclopentadienyl, pentamethylcyclopentadienyl, ethylcyclopentadienyl, isopropylcyclopentadienyl, tertbutylcyclopentadienyl, and indenyl), alkoxide (for example, methoxide, ethoxide, isopropoxide, and tertbutoxide), alkyl (for example, methyl, ethyl, propyl, and butyl), carbonyl, cyclo-octadiene, benzene or hydrogen ligand. In other embodiments X$_y$ may comprise mixtures thereof. However, at least one of the X$_y$ ligands is preferably a halogen. As an example, bis(cyclopentadienyl)hafnium dichloride or bis(cyclopentadienyl)tantalum(V) trichloride, can be used as a metal precursor in some embodiments.

A carbide film is deposited by an ALD process comprising the following steps:
1. providing a transition metal halide (e.g. TaCl$_5$, TaF$_5$, TiCl$_4$ or ZrCl$_4$) to the reaction space;
2. removing excess transition metal halide from the reaction space by purging and/or evacuation;
3. providing an organometallic or metalorganic compound to the reaction space;
4. removing excess organometallic or metalorganic compound by purging and/or evacuation; and
5. providing hydrogen radicals to the reaction space.

In some embodiments step 5 is included in each cycle, while in other embodiments steps 1-4 are repeated multiple cycles before introducing step 5. That is, the hydrogen radicals may be provided at intervals in the deposition cycle. Preferably the hydrogen radicals are initially provided at a point in the deposition process where the thin film is thick enough that the radicals can not penetrate the film and damage the underlying substrate.

Deposition of Silicon-Containing Films

Silicon-containing metal films or metal silicides are commonly used as conductive electrodes. Tungsten silicide (WSi$_x$) is an example of a metal silicide. A WSi$_x$ film has been formed by alternating and sequential pulses of WF$_6$ and Si$_2$H$_6$. However, this procedure undesirably leads to powder generation, producing films with properties unsuited for common applications. It has been found that use of a deposition-enhancing agent, such as TEB, in an ALD reaction with WF$_6$ and Si$_2$H$_6$ can produce WSi$_x$ films with improved film properties (i.e., reduced impurity levels).

In some embodiments, silicon-containing metal or metal silicide thin film are deposited by the following pulsing sequence:

(MX$_y$+purge+silicon source chemical+purge+deposition-enhancing agent+purge)×m$_1$, or (MX$_y$+purge+deposition-enhancing agent+purge+silicon source chemical+purge)×m$_1$ wherein m$_1$ is the number of total cycles. M is a metal atom, preferably selected from the group consisting of Ti, Zr, Hf, V, Nb, Ta, Cr, Mo, W and Al. In other embodiments, M is selected from the group consisting of Fe, Mn, Ni, Co, Cu, Zn, Cd, Ge, Si, Sn, Sb, Ga, Ru, Ir, Pd, Pt, Au, Rh, Re, B, In.

X$_y$ is one or more ligands for M. Each X is preferably a halogen ligand selected from the group consisting of I, Br, Cl and F. However, in some embodiments at least one X can be a metalorganic ligand, such as a cyclopentadienyl (for example, cyclopentadienyl, methylcyclopentadienyl, pentamethylcyclopentadienyl, ethylcyclopentadienyl, isopropylcyclopentadienyl, tertbutylcyclopentadienyl, and indenyl), alkoxide (for example, methoxide, ethoxide, isopropoxide, and tertbutoxide), alkyl (for example, methyl, ethyl, propyl, and butyl), carbonyl, cyclo-octadiene, benzene or hydrogen ligand. In other embodiments X$_y$ may comprise mixtures thereof. However, at least one of the X$_y$ ligands is preferably a halogen. As an example, bis(cyclopentadienyl)hafnium dichloride or bis(cyclopentadienyl)tantalum(V) trichloride, can be used as a metal precursor in some embodiments.

In preferred embodiments, the silicon source chemical is a silane (Si$_x$H$_y$). Other silicon source chemicals that can be used will be known to the skilled artisan.

The deposition-enhancing agent is selected from the group consisting of hydrocarbons, hydrogen, hydrogen plasma, hydrogen radicals, silanes, germanium compounds, nitrogen compounds, boron compounds and boranes. In a more preferred embodiment, the deposition-enhancing agent is a boron compound, more preferably triethyl boron (TEB).

In one embodiment, formation of a WSi$_x$ film proceeds using the pulsing sequence:

(WF$_6$+purge+Si$_2$H$_6$+purge+TEB+purge)]×m$_2$, wherein m$_2$ is the number of total cycles and TEB is the deposition-enhancing agent. By controlling the concentrations of the silicon source chemical and deposition enhancing agent, highly conductive WSi$_x$ films with substantially reduced impurity content compared to prior art processes are produced.

Deposition of Oxygen-Containing Films

Metal oxides have several important applications, such as insulators and transparent conductors. In future devices progressively thinner films are needed. In addition, they need to be grown conformally in narrow trenches. In some applications, such as optics, nanolaminates with sharp interfaces between materials are needed.

In one embodiment, a general pulsing sequence for oxygen-containing metal thin film deposition may be:

(MX$_y$+purge+oxidizing reactant+purge+deposition-enhancing agent+purge)×m$_1$ or (MX$_y$+purge+deposition-enhancing agent+purge+oxidizing reactant+purge)×m$_1$ wherein m$_1$ is the number of total cycles. M is a metal atom, preferably selected from the group consisting of Ti, Zr, Hf, V, Nb, Ta, Cr, Mo, W and Al. In other embodiments, M can be selected from the group consisting of Fe, Mn, Ni, Co, Cu, Zn, Cd, Ge, Si, Sn, Sb, Ga, Ru, Ir, Pd, Pt, Au, Rh, Re, B, In.

X$_y$ is one or more ligands for M. Each X is preferably a halogen ligand selected from the group consisting of I, Br, Cl and F. However, in some embodiments at least one X can be a metalorganic ligand, such as a cyclopentadienyl (for example, cyclopentadienyl, methylcyclopentadienyl, pentamethylcyclopentadienyl, ethylcyclopentadienyl, isopropylcyclopentadienyl, tertbutylcyclopentadienyl, and indenyl), alkoxide (for example, methoxide, ethoxide, isopropoxide, and tertbutoxide), alkyl (for example, methyl, ethyl, propyl, and butyl), carbonyl, cyclo-octadiene, benzene or hydrogen ligand. In other embodiments X$_y$ may comprise mixtures thereof. However, at least one of the X$_y$ ligands is preferably a halogen. As an example, bis(cyclopentadienyl)hafnium dichloride or bis(cyclopentadienyl)tantalum(V) trichloride, can be used as a metal precursor in some embodiments.

The oxidizing reactant or oxygen source chemical is preferably selected from the group consisting of $H_2O$, $O_2$, ozone, oxygen radicals and oxygen plasma. The deposition-enhancing agent is preferably selected from the group consisting of hydrocarbons, hydrogen, hydrogen plasma, hydrogen radicals, silanes, germanium compounds, nitrogen compounds, boron compounds and boranes. More preferably, the deposition enhancing agent is selected from the group including, but not limited to hydrocarbons, such as alkanes, alkenes and alkynes. In some embodiments, the deposition-enhancing agent is acetylene ($C_2H_2$).

As an example, when $WCl_6$ is used in a deposition reaction with $H_2O$, the starting surface is chlorinated, causing poor film growth and properties. However, if a deposition enhancing agent, such as, for example, acetylene ($C_2H_2$), is used in the reaction in the cycle described above, film growth and properties are substantially improved. The film growth may be written:

$$2\text{-OH(s)} + WCl_6(g) \rightarrow \text{---}OWCl_x(s) + HCl(g)$$

$$\text{---}OWCl_x(s) + H_2O(g) \rightarrow \text{---}OWOHCl_x(s) + HCl(g)$$

$$\text{---}OWCl_x(s) + C_2H_2(g) \rightarrow \text{---}WO_2(s) + C_2H_2Cl_2(g)$$

As an alternative, the acetylene pulse may be applied before the water pulse:

$$2\text{-OH(s)} + WCl_6(g) \rightarrow \text{---}OWCl_x(s) + HCl(g)$$

$$\text{---}OWCl_x(s) + C_2H_2(g) \rightarrow \text{---}OW(s) + HCl(g)$$

$$\text{---}OW(s) + H_2O(g) \rightarrow \text{---}W(OH)_2(s)$$

As another example, $MoO_x$ can be grown using $MoCl_5$, $H_2O$ and a deposition-enhancing agent, such as, e.g., $C_2H_2$:

$$2\text{-OH(s)} + MoCl_5(g) \rightarrow \text{---}OMoCl_x(s) + HCl(g)$$

$$\text{---}OMoCl_x(s) + H_2O(g) \rightarrow \text{---}OMoOHCl_x(s) + HCl(g)$$

$$\text{---}OMoCl_x(s) + C_2H_2(g) \rightarrow \text{---}MoO_2(s) + C_2H_2Cl_2(g)$$

As an alternative, the acetylene pulse may be applied before the water pulse:

$$2\text{-OH(s)} + MoCl_6(g) \rightarrow \text{---}OMoCl_x(s) + HCl(g)$$

$$\text{---}OMoCl_x(s) + C_2H_2(g) \rightarrow \text{---}OMo(s) + HCl(g)$$

$$\text{---}OMo(s) + H_2O(g) \rightarrow \text{---}Mo(OH)_2(s)$$

As discussed above, use of a deposition-enhancing agent for oxygen-containing film growth has beneficial consequences. For example, the growth rate of $In_2O_3$, which is an important conductive oxide, is typically low. However, use of a deposition-enhancing agent, such as, e.g., acetylene, allows removal of impurities at low temperatures. $SnO_2$ is also an important conductive oxide. In particular, the combination of $In_2O_3$ and $SnO_2$ (i.e., ITO) is a very important conductive oxide.

As another example illustrating the beneficial consequences of deposition-enhancing agent usage, a $TiO_2$ film, which has a high permittivity (~80), usually has a high leakage current when deposited by previous processes, which limits its use as a dielectric. Oxygen deficiency has been speculated as the reason for the high leakage current. Carbon from acetylene used as a deposition-enhancing agent according to the present methods advantageously fills these vacancies and overcomes these problems.

As yet another example, $HfO_2$ is one of the key candidates as a gate oxide in MOSFET transistors. The best electrical results have been obtained using $HfCl_4$ and $H_2O$. However, even trace amounts of chlorine can cause device failure. Acetylene-assisted growth cleans the interface and its use as a deposition enhancing agent in the methods disclosed above allows the deposition of pure $HfO_2$ films at low temperatures.

Deposition of Elemental Metal Films

Conformal ALD deposited elemental metal films are desirable in many semiconductor applications, such as diffusion barriers for Cu interconnects, metal electrodes for gate stacks and metal-insulator-metal (MIM) structures. For example, combination of a Cu diffusion barrier and a pure metal (e.g., W) with low resistivity can be used for direct Cu plating.

ALD of W may be achieved using sequential and alternating pulses of $WF_6$ and a reducing agent, such as $Si_2H_6$ or $B_2H_6$. The inventors have observed that the formation of tungsten films using dilute $Si_2H_6$ may lead to the production of powders, which makes use of this pulsing scheme in industrial practice undesirable due to the risk of particle generation. However, powder production in the deposition of metal films can be substantially reduced using a deposition-enhancing agent.

In one embodiment, a pulsing sequence for metal thin film deposition by ALD is:

$$(\text{deposition-enhancing agent} + \text{purge} + MX_y + \text{purge} + \text{reducing agent} + \text{purge}) \times m_1,$$

or $$(MX_y + \text{purge deposition-enhancing agent} + \text{purge} + \text{reducing agent} + \text{purge}) \times m_1,$$

wherein $m_1$ is the number of total cycles. M is a metal atom, preferably selected from the group consisting of Ti, Zr, Hf, V, Nb, Ta, Cr, Mo, W and Al. In other embodiments, M can be selected from the group consisting of Fe, Mn, Ni, Co, Cu, Zn, Cd, Ge, Si, Sn, Sb, Ga, Ru, Ir, Pd, Pt, Au, Rh, Re, B, and In.

$X_y$ is one or more ligands for M. Each X is preferably a halogen ligand selected from the group consisting of I, Br, Cl and F. However, in some embodiments at least one X can be a metalorganic ligand, such as a cyclopentadienyl (for example, cyclopentadienyl, methylcyclopentadienyl, pentamethylcyclopentadienyl, ethylcyclopentadienyl, isopropylcyclopentadienyl, tertbutylcyclopentadienyl, and indenyl), alkoxide (for example, methoxide, ethoxide, isopropoxide, and tertbutoxide), alkyl (for example, methyl, ethyl, propyl, and butyl), carbonyl, cyclo-octadiene, benzene or hydrogen ligand. In other embodiments $X_y$ may comprise mixtures thereof. However, at least one of the $X_y$ ligands is preferably a halogen. As an example, bis(cyclopentadienyl)hafnium dichloride or bis(cyclopentadienyl)tantalum(V) trichloride, can be used as a metal precursor in some embodiments.

The reducing agent is preferably selected from the group including silanes (e.g., $Si_2H_6$) and boranes (e.g., $B_2H_6$); and the deposition-enhancing agent is selected from the group consisting of hydrocarbons, hydrogen, hydrogen plasma, hydrogen radicals, silanes, germanium compounds, nitrogen compounds, boron compounds and boranes. In a preferred embodiment the deposition-enhancing agent is a boron compound, preferably TEB.

As one example, a low resistivity W film was formed at a substrate temperature between about 200° C. and 350° C. using the following pulsing sequence:

$$[\text{TEB} + \text{purge} + WF_6 + \text{purge} + Si_2H_6 + \text{purge}] \times m_2$$

wherein $m_2$ is the number of total cycles and TEB is the deposition-enhancing agent. X-ray diffraction (XRD) spectra and x-ray photoelectron spectroscopy (XPS) sputtering time profiles of low resistivity tungsten films formed according to the pulsing sequence above showed that there was no powder formation.

Semiconductor Device Applications

Methods of fabricating semiconductor device structures will now be discussed. Although described in terms of several specific contexts, one of skill in the art will recognize that the processes described herein are applicable to many other contexts as well.

Carbon-Containing Films as Electrodes

Figure 3:
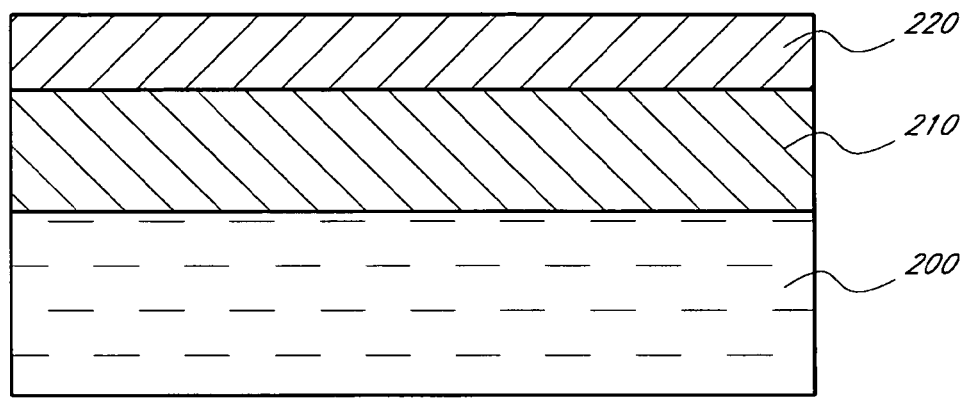
FIG. 3 is a schematic cross-sectional side view of a electrode structure, comprising a layer of a conductive metal carbide, according to preferred embodiments of the invention.

In some embodiments a electrode is formed by ALD of conductive metal carbide. With reference to FIG. 3, a silicon substrate 200 is illustrated comprising a layer of high-k dielectric material 210. The substrate may be treated prior to deposition of the high-k material. For example, in some embodiments, a thin interfacial layer (not shown) may be deposited prior to deposition of the high-k material. In one embodiment a thin chemical oxide or oxynitride is formed on the surface. In other embodiments a thermal oxide is grown on the substrate.

"High-k" generally refers to a dielectric material having a dielectric constant (k) value greater than that of silicon oxide. Preferably, the high-k material has a dielectric constant greater than 5, more preferably greater than about 10. Exemplary high-k materials include, without limitation, $HfO_2$, $ZrO_2$, $Al_2O_3$, $TiO_2$, $Ta_2O_5$, $Sc_2O_3$, lanthanide oxides and mixtures thereof, silicates and materials such as YSZ (yttria-stabilized zirconia), barium strontium titanate (BST), strontium titanate (ST), strontium bismuth tantalate (SBT) and bismuth tantalate (BT). Preferably, the high-k material is also deposited by an ALD process.

A layer or thin film of conductive metal carbide 220 is deposited over the dielectric (high-k material) layer 210 by ALD, as described above, to form the illustrated structure. It will be appreciated that in the illustrated embodiment the layers are not necessarily drawn to scale. The metal carbide and underlying high-k material are patterned to form an electrode.

The metal carbide thin film 220 is preferably deposited over the dielectric layer 210 by contacting the substrate with alternating pulses of a metal source chemical, carbon source chemical and a deposition-enhancing agent (not necessarily in this order), as described above. The metal source chemical is preferably a halide compound (e.g., $TaCl_5$) and the carbon source chemical is preferably an organometallic compound, such as, e.g., trimethyl aluminum (TMA).

The deposition-enhancing agent may be a hydrocarbon selected from the group including, but not limited to, alkanes, alkenes and alkynes. In one embodiment, the deposition-enhancing agent is acetylene. ($C_2H_2$). In other embodiments the deposition-enhancing agent comprises hydrogen radicals. Unreacted source chemicals and reaction byproducts are removed from the reaction chamber after each source chemical pulse, for example by evacuation and/or purging with an inert gas (e.g., $N_2$). In some embodiments, evacuation is achieved using a vacuum pump or a plurality of vacuum pumps. The pulsing cycle is repeated until a metal carbide layer of the desired thickness has been formed. Preferably, the metal carbide layer has a thickness between about 5 Å and about 1000 Å.

The conductive metal carbides deposited to form the electrode in these embodiments are preferably selected from the group consisting of Ti, Zr, Hf, V, Nb, Ta, Cr, Mo, W and Al carbides. Further non-conductive carbide SiC can also be deposited.

In some embodiments the metal carbide forms the electrode. In other embodiments (not shown) another conductive material, such as a metal or poly-Si, is deposited over the metal carbide. The additional conductive material may be deposited by ALD or by another deposition process, such as by CVD or PVD. The deposition may be selective, or may be followed by patterning steps. According to still another embodiment, annealing can be performed after the metal carbide deposition. Suitable atmospheres, such as $N_2$ or forming gas ($N_2/H_2$) are apparent to skilled artisan.

Further processing steps, such as spacer deposition and source/drain implantation, will be apparent to the skilled artisan.

Carbon-Containing Films as Barrier Layers

Figure 4:
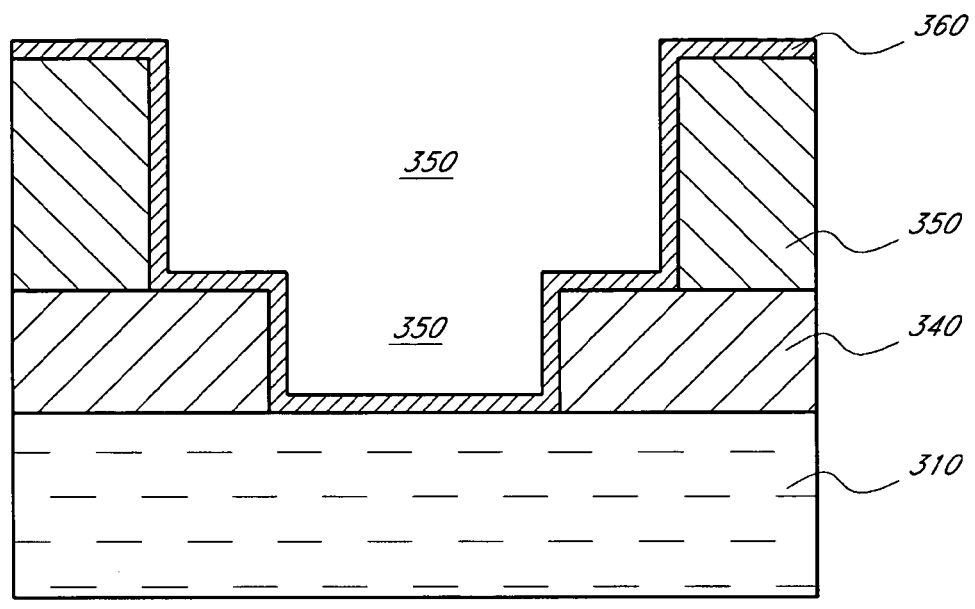
FIG. 4 is a schematic cross-sectional side view of a dual damascene structure, comprising a metal carbide thin barrier layer formed over the trench and via, according to preferred embodiments of the invention.

Metal carbide thin film can be deposited by ALD to form a barrier layer for interconnect metallization. The substrate may comprise damascene or dual damascene structures, including high aspect ratio trenches and vias. With reference to FIG. 4, in one embodiment, a dual damascene structure 300 comprises a trench 310, via 320, and dielectric layers 340 and 350. In the illustrated embodiment, the layers are not necessarily drawn to scale. The structure 300 is placed in an ALD reaction chamber and a metal carbide thin film barrier layer 360 is deposited over the trench 310 and via 320 by contacting the structure 300 with alternating pulses of a metal source chemical, carbon source chemical and deposition-enhancing agent (not necessarily in this order), as described above.

In the preferred embodiment, the metal source chemical is a halide compound, the carbon source is an organometallic compound and the deposition-enhancing agent is a hydrocarbon or hydrogen radicals. Unreacted source chemicals and reaction byproducts are removed from the reaction chamber after each pulse of source chemical, as described above. The pulsing cycle is repeated until a barrier layer of the desired thickness has been formed. Preferably, the barrier layer has a thickness between about 5 Å and about 100 Å.

In all of the aforesaid embodiments, any element used in an embodiment can interchangeably be used in another embodiment unless such a replacement is not feasible.

It will be understood by those of skill in the art that numerous and various modifications can be made without departing from the spirit of the present invention. Therefore, it should be clearly understood that the forms of the present invention are illustrative only and are not intended to limit the scope of the present invention. All modifications and changes are intended to fall within the scope of the invention, as defined by the appended claims.

What is claimed is:

1. An atomic layer deposition (ALD) process for forming a metal-containing thin film on a substrate comprising a plurality of deposition cycles in which the substrate is alternately and sequentially contacted with a first reactant that comprises $TiCl_4$ and a second reactant comprising triethylaluminum (TEA), wherein in at least one of the deposition cycles the substrate is contacted with a third reactant selected from the group consisting of hydrocarbons, hydrogen, hydrogen plasma, hydrogen radicals, silanes, germanium compounds, nitrogen compounds, boron compounds and boranes.

2. The process of claim 1, wherein the substrate is contacted with the third reactant in each of the plurality of deposition cycles.

3. The process of claim 1, wherein the third reactant is an alkane, alkene or alkyne.

4. The process of claim 3, wherein the third reactant is acetylene.

5. The process of claim 1, wherein the third reactant is a silane or borane.

6. The process of claim 1, wherein at least one deposition cycle comprises:
contacting the substrate with $TiCl_4$;
removing excess $TiCl_4$ from the reaction space;
contacting the substrate with TEA;
removing excess TEA from the reaction space.

7. The process of claim 1, wherein the plurality of deposition cycles is carried out at a reaction temperature from about 350° C. to about 450° C.

8. A method for depositing a thin film on a substrate in a reaction chamber, the method comprising:
carrying out one or more atomic layer deposition (ALD) cycles, each ALD cycle comprising contacting the substrate with alternate, sequential pulses of $TiCl_4$ and triethylaluminum (TEA), wherein subsequent to at least one ALD cycle, the substrate is contacted with a third reactant that is capable of removing halide ligands from the substrate surface or the reaction space.

9. The method of claim 8, wherein the ALD cycle is repeated multiple times prior to contacting the substrate with the third reactant.

10. The method of claim 8, wherein the third reactant comprises one or more of hydrocarbons, hydrogen, hydrogen plasma, hydrogen radicals, silanes, germanium compounds, nitrogen compounds, and boron compounds.

11. The method of claim 8, wherein the third reactant comprises a silane or borane.

12. The method of claim 8, wherein the third reactant is acetylene.

13. The method of claim 8, wherein the third reactant comprises hydrogen radicals.

14. The method of claim 8, wherein the substrate is contacted with hydrogen radicals at one or more intervals while carrying out the one or more ALD cycles.

* * * * *